(12) United States Patent
Kawaguchi

(10) Patent No.: US 8,257,097 B2
(45) Date of Patent: Sep. 4, 2012

(54) ELECTRIC JUNCTION BOX

(75) Inventor: Kiyofumi Kawaguchi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 13/084,830

(22) Filed: Apr. 12, 2011

(65) Prior Publication Data

US 2012/0064740 A1    Mar. 15, 2012

(30) Foreign Application Priority Data

Sep. 14, 2010 (JP) ................................ 2010-205829

(51) Int. Cl.
*H01R 12/00* (2006.01)

(52) U.S. Cl. ...................................................... 439/76.2

(58) Field of Classification Search ............... 439/76.2, 439/949, 721, 723, 724
See application file for complete search history.

(56) References Cited

U.S. PATENT DOCUMENTS

| | | | | |
|---|---|---|---|---|
| 5,038,050 A * | 8/1991 | Minoura | ...................... | 307/10.1 |
| 6,050,856 A * | 4/2000 | Sugiura | ..................... | 439/620.27 |
| 6,364,670 B1 * | 4/2002 | Wickett et al. | ................ | 439/76.2 |
| 6,602,079 B2 * | 8/2003 | Chiriku et al. | ................ | 439/76.2 |
| 6,634,892 B2 * | 10/2003 | Nakamura | .................... | 439/76.2 |
| 6,655,967 B2 * | 12/2003 | Oda | ............................. | 439/76.2 |
| 6,814,591 B2 * | 11/2004 | Oka et al. | ...................... | 439/76.2 |
| 6,846,204 B2 * | 1/2005 | Oda | ............................. | 439/709 |
| 6,870,097 B2 * | 3/2005 | Oda | ................................ | 174/50 |
| 6,875,028 B2 * | 4/2005 | Kita et al. | ..................... | 439/76.2 |
| 6,919,509 B2 * | 7/2005 | Oda | ................................ | 174/59 |
| 7,212,089 B2 * | 5/2007 | Nakamura et al. | ............... | 335/78 |
| 7,335,035 B2 * | 2/2008 | Shirota | ........................ | 439/76.2 |
| 7,351,911 B2 * | 4/2008 | Chiriku et al. | .................. | 174/59 |
| 7,771,212 B2 * | 8/2010 | Miyamoto | .................... | 439/76.2 |
| 2002/0022388 A1 * | 2/2002 | Oda | ............................. | 439/76.2 |
| 2002/0080562 A1 * | 6/2002 | Nakamura et al. | ............. | 361/626 |
| 2002/0081905 A1 * | 6/2002 | Nakamura et al. | ............ | 439/621 |
| 2002/0168882 A1 * | 11/2002 | Chiriku et al. | ............... | 439/76.2 |
| 2003/0082937 A1 * | 5/2003 | Burdick | ....................... | 439/76.2 |
| 2003/0236008 A1 * | 12/2003 | Kita et al. | ..................... | 439/76.2 |
| 2005/0032401 A1 * | 2/2005 | Kobayashi | .................... | 439/76.2 |
| 2005/0233617 A1 * | 10/2005 | Yamashita | .................... | 439/76.2 |
| 2005/0233618 A1 * | 10/2005 | Yamashita | .................... | 439/76.2 |
| 2007/0020968 A1 * | 1/2007 | Oka | ................................. | 439/76.2 |
| 2008/0014767 A1 * | 1/2008 | Oka et al. | ...................... | 439/76.2 |
| 2008/0200045 A1 * | 8/2008 | Akahori et al. | ............... | 439/76.2 |
| 2012/0064740 A1 * | 3/2012 | Kawaguchi | ................... | 439/76.1 |
| 2012/0064741 A1 * | 3/2012 | Kawaguchi et al. | .......... | 439/76.2 |

FOREIGN PATENT DOCUMENTS

JP     2005-130634     5/2005

\* cited by examiner

*Primary Examiner* — Ross Gushi

(74) *Attorney, Agent, or Firm* — Greenblum & Bernstein, P.L.C.

(57) ABSTRACT

A connector housing conducting power to a coil is integrated straddling adjacent relay housings on external peripheral surfaces thereof and utilizing a peripheral wall of the adjacent relay housings, the adjacent relay housings being separated by and sharing a partition wall as a portion of a wall portion. A bus bar straddling the connector housing and the adjacent relay housings forms a conductive path from an external power supply terminal provided in the connector housing to a relay coil power supply terminal provided in each of the adjacent relay housings.

8 Claims, 3 Drawing Sheets

ELECTRIC JUNCTION BOX

CROSS-REFERENCE TO RELATED APPLICATIONS

The present application claims priority under 35 U.S.C. §119 of Japanese Application No. 2010-205829, filed on Sep. 14, 2010, which is herein expressly incorporated by reference in its entirety.

BACKGROUND OF THE INVENTION

1. Field of the Invention

The present invention relates to an electric junction box provided with a plurality of relays.

2. Description of Related Art

A conventionally known electric junction box mounted in a vehicle is disposed between a battery and vehicle electrical components, such as a lamp and a horn, and is provided with a plurality of relays that connect or disconnect power to the vehicle electrical components.

With a recent increase in vehicle electrical components, the number of relays mounted in the electric junction box also tends to increase. In addition, the electric junction box is required to be smaller. Compared with other electrical components, such as a fuse, a relay is a large component. In particular, the size of a high-voltage relay is substantially large, thus requiring a large mounting space. It is thus required that a conductive circuit be disposed efficiently in terms of space, the conductive circuit including a space for mounting a relay and a bus bar. In order to conduct power to coil power supply terminals of a plurality of relays, in particular, it is necessary to wire a conductive circuit of a bus bar from a coil power supply portion, such as a connector housing for conducting power to coils, to the coil power supply terminals of the relays. It is important to dispose the bus bar for conduction efficiently in terms of space to the coil power supply terminals of the relays.

Japanese Patent Laid-open Publication No. 2005-130634 discloses a configuration to improve space efficiency in which relays are mounted alternately in opposite directions so as to secure an area to dispose bus bars and the bus bars for the relays are partitioned by insulating plates and disposed in layer.

However, the configuration of Japanese Patent Laid-open Publication No. 2005-130634, which requires the bus bars to be partitioned by the insulating plates and layered, incurs cost increase due to an increase in the number of components and falls short of meeting the demand of downsizing due to the height of the electric junction box. Furthermore, a connector mounting portion for conduction, which is a power supply portion, is provided separately away from a relay mounting portion. Thus, a distance to a coil power supply terminal is long and a circumstance in which a large space is required to place the bus bars is not sufficiently addressed.

SUMMARY OF THE INVENTION

In view of the circumstances above, the present invention provides an electric junction box having a novel structure in which a plurality of relay housings and a connector housing that conducts power to a coil are disposed with excellent space efficiency and a conductive circuit to a coil power supply terminal provided by a bus bar is simplified.

A first aspect of the present invention provides an electric junction box having a case that houses a bus bar and includes an internal circuit and having a plurality of relay housings open to outside of the case. The plurality of relay housings are integrated having a plurality of openings separated by a partition wall that is shared by adjacent relay housings as a portion of a wall portion. A connector housing is integrated straddling the adjacent relay housings having the partition wall therebetween on external peripheral surfaces thereof and utilizing a peripheral wall of the adjacent relay housings, the connector housing conducting power to a coil and being open to a direction same as that of the adjacent relay housings. A relay coil power supply terminal for each of the relay housing is provided on the peripheral wall side on which the connector housing is provided. The bus bar is disposed straddling the adjacent relay housings and the connector housing, and the bus bar forms a conductive path from an external power supply terminal provided in the connector housing to the relay coil power supply terminal provided in each of the adjacent relay housings.

According to the present invention, the plurality of relay housings are adjacently disposed and integrated by sharing the partition wall therebetween. Thereby, relays mounted in the relay housings can be disposed more proximately, thus improving space efficiency.

Furthermore, the connector housing conducting power to the coil is integrated straddling the adjacent relay housings having the partition wall therebetween on external peripheral surfaces thereof and utilizing the peripheral wall of the adjacent relay housings. Providing the connector housing proximate to the relay housings further improves the space efficiency. Alternatively, the connector housing may be integrally provided on the external surface of the peripheral wall of the relay housings. The connector housing is thus integrated with the peripheral wall of the adjacent relay housings having the partition wall therebetween, thereby ensuring rigidity as a whole and sufficient support strength of the connector housing.

The relay coil power supply terminal is provided on the peripheral wall side on which the connector housing is provided, thus efficiently reducing the length of the bus bar that forms the conductive path that wires the connector housing and the relay coil power supply terminal. Consequently, the space efficiency can be improved and the production cost can be reduced. Furthermore, problems can be prevented, such as an increase in conduction resistance attributed to a long bus bar and heat generation.

According to the first aspect of the present invention, the plurality of relay housings and the connector housing are consolidated and integrated on the side of the relay coil power supply terminal as above, thus concurrently and efficiently achieving improvement in the space efficiency, enhancement of the rigidity of the housing as a whole, and shortening of the bus bar.

A second aspect of the present invention provides the electric junction box according to the first aspect, in which a plurality of bus bars are provided; at least one of the bus bars is integrally provided with the external power supply terminal in the connector housing and the plurality of relay coil power supply terminals in the respective plurality of relay housings; and the external power supply terminal to the plurality of relay coil power supply terminals is shared.

According to the second aspect, one external power supply terminal and the plurality of relay coil power supply terminals are provided on one bus bar, thus achieving superior space efficiency. Specifically, the connector housing conducting power to the coil is provided between the adjacent relay housings in the present invention. Thereby, the length of the conductive path can be reduced, and the conductive path can be shared from the external power supply terminal to the relay coil power supply terminals. Thus, the space to provide the conductive path is further efficiently used.

A third aspect of the present invention provides the electric junction box according to the first or second aspect, in which a bottom wall portion is provided to the connector housing in an intermediate portion in a height direction of the peripheral wall of the relay housings; and the external power supply terminal passes through the bottom wall portion of the connector housing and projects into the connector housing.

The connector housing, which has a smaller opening area or perimeter than the relay housings, is advantageous in terms of strength. Since the bottom wall portion of the connector housing is provided in the intermediate portion in the height direction of the relay housings, the peripheral wall of the relay housings is further reinforced by the bottom wall portion.

A fourth aspect of the present invention provides the electric junction box according to one of the first to third aspects, in which the peripheral wall of the relay housings integrally provided with the connector housing extends along a peripheral wall portion of the case; and the connector housing projects outside of the peripheral wall portion of the case.

According to the fourth aspect of the present invention, the rigidity is sufficiently ensured in the peripheral wall of the relay housings to which the connector housing is provided. Thus, the support strength of the integrally provided connector housing can be sufficiently ensured, and the connector housing can be integrated with a portion thereof projecting from the peripheral wall portion of the case. Since the connector housing projects from the case, the space inside of the electric junction box can efficiently be secured, and concurrently the connector housing conducting power to the coil can be provided on the coil terminal side efficiently in terms of the space.

According to the present invention, the plurality of relay housings are provided sharing the partition wall therebetween as a portion of the wall portion. The connector housing conducting power to the coil is integrated straddling the adjacent relay housings on the external peripheral surfaces thereof and utilizing the peripheral wall of the relay housings. The relay coil power supply terminals of the relay housings are provided on the connector housing side. The conductive path from the external power supply terminal in the connector housing to the relay coil power supply terminals is formed by the bus bar. Thereby, the plurality of relay housings and the connector housing are consolidated to enhance the space efficiency. Furthermore, providing the relay coil power supply terminals on the connector housing side reduces the length of the bus bar and simplifies the bus bar, thus further enhancing the space efficiency and reducing the production cost.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

Figure 1:
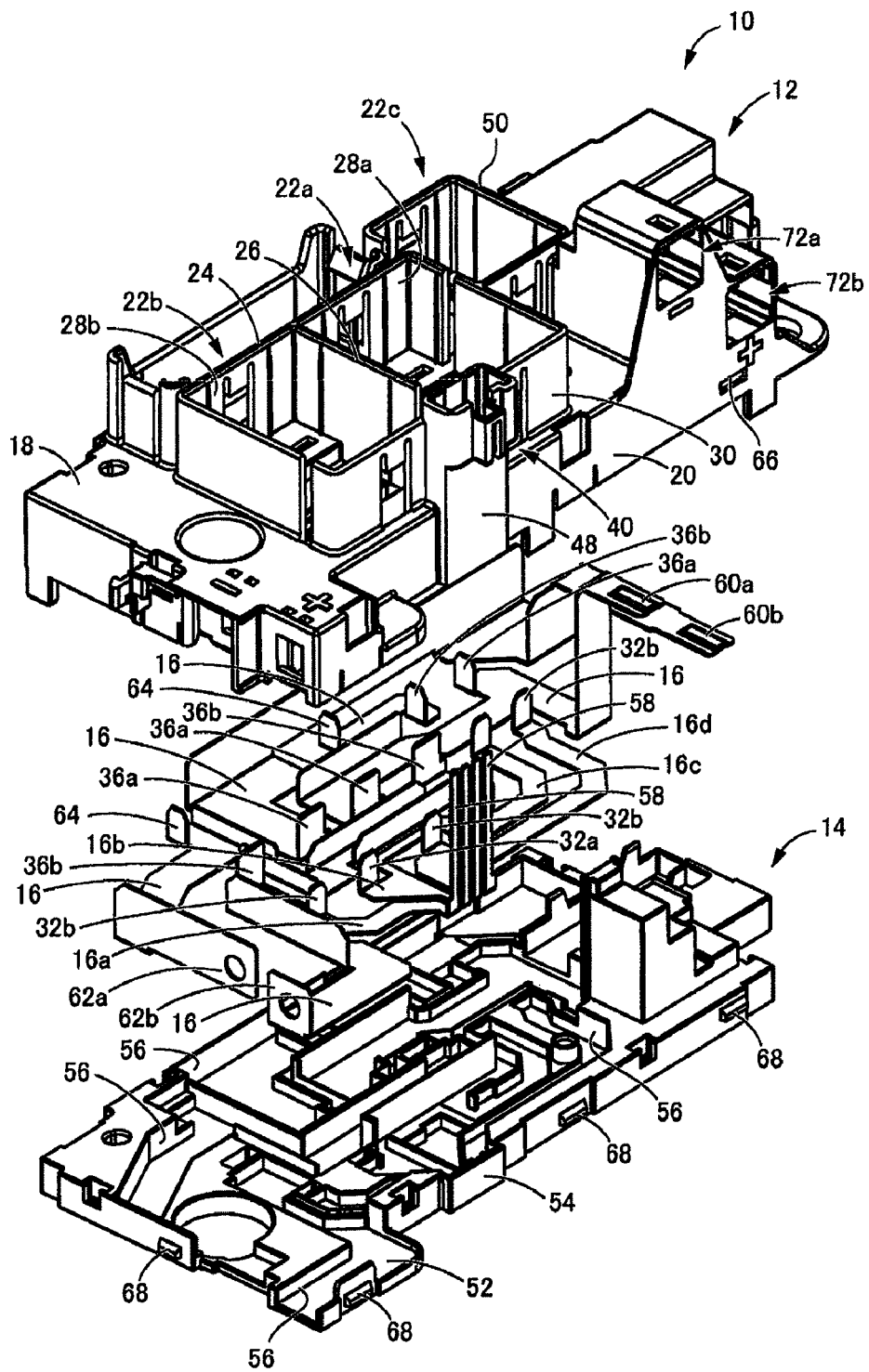
FIG. 1 is an exploded perspective view of an electric junction box according to an embodiment of the present invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiments of the present invention are explained below with reference to the drawings.

An electric junction box 10 according to an embodiment of the present invention is shown in FIGS. 1 to 4. The electric junction box 10 includes an upper case 12 and a lower case 14, between which a plurality of bus bars 16 configuring an internal circuit are housed.

The upper case 12 is composed of a non-conductive synthetic resin. The upper case 12 has substantially a rectangular box shape open to the lower case 14 and provided with a peripheral wall portion 20 projecting from an external peripheral portion of a plate portion 18.

The upper case 12 is provided with a plurality of relay housings 22a, 22b, and 22c. Since the relay housings 22a, 22b, and 22c have substantially the same shape, a structure common to all is explained with the same numeral references assigned in the drawings, without distinguishing the relay housings 22a, 22b, and 22c.

The relay housings 22a and 22b are substantially of the same size. The relay housings 22a and 22b include two openings 28a and 28b, respectively, open to above (upward in FIG. 3), which are formed by partitioning a rectangular peripheral wall 24 projecting from the plate portion 18 with a partition wall 26. Thereby, the relay housings 22a and 22b are surrounded by the peripheral wall 24 and adjacently integrated having the partition wall 26 in between. The partition wall 26 is shared as a portion of each wall portion. The peripheral wall 24 is positioned slightly inward from the external peripheral portion of the plate portion 18. An external peripheral surface 30 of the peripheral wall 24 is positioned slightly inward from the peripheral wall portion 20 of the upper case 12 and extends along the peripheral wall portion 20.

Figure 2:
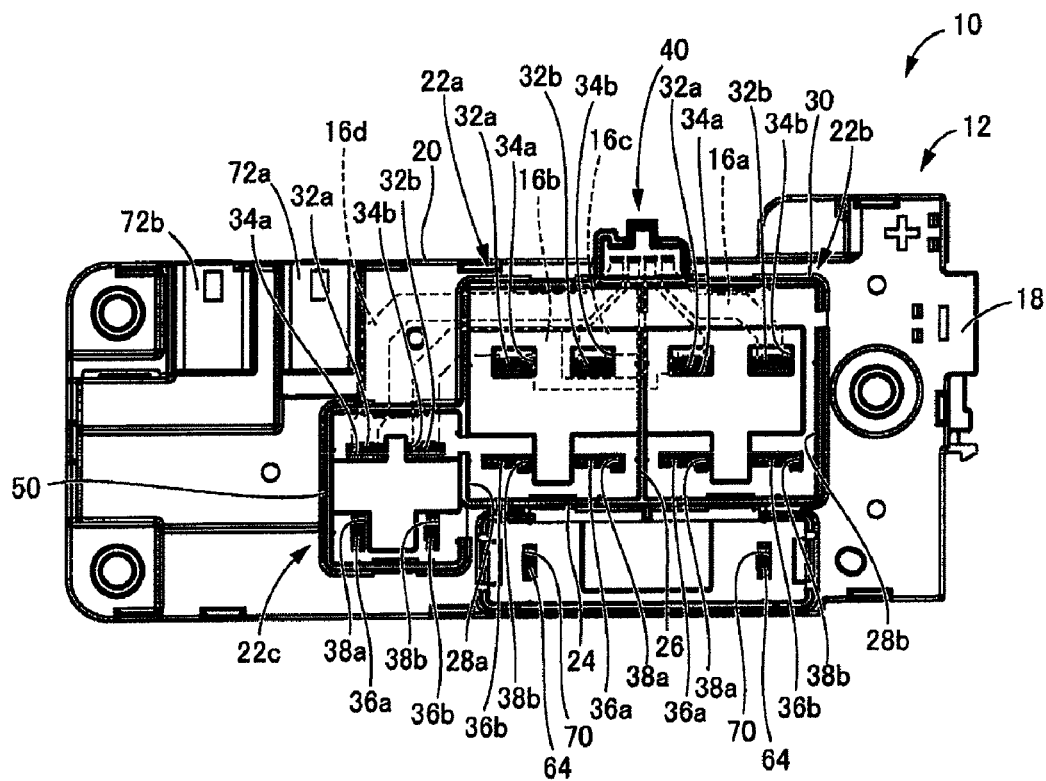
FIG. 2 is a plan view of the electric junction box shown in FIG. 1.

As shown in FIG. 2, the relay housings 22a and 22b are each provided with coil terminal through-holes 34a and 34b and switch terminal through-holes 38a and 38b penetrating the plate portion 18, as conventionally known. The coil terminal through-holes 34a and 34b are provided to insert therethrough relay coil power supply terminals 32a and 32b, respectively, provided on the bus bars 16. The switch terminal through-holes 38a and 38b are provided to insert therethrough relay switch terminals 36a and 36b, respectively, provided on the bus bars 16. The coil terminal through-holes 34a and 34b and the switch terminal through-holes 38a and 38b are provided in an area surrounded by the peripheral wall 24 and the partition wall 26. The coil terminal through-holes 34a and 34b are adjacently aligned on a straight line. The switch terminal through-holes 38a and 38b are adjacently aligned on a straight line distant from the coil terminal through-holes 34a and 34b. The coil terminal through-holes 34a and 34b are positioned more outward of the upper case 12 than the switch terminal through-holes 38a and 38b and proximate to the external peripheral surface 30 of the peripheral wall 24.

Figure 4:
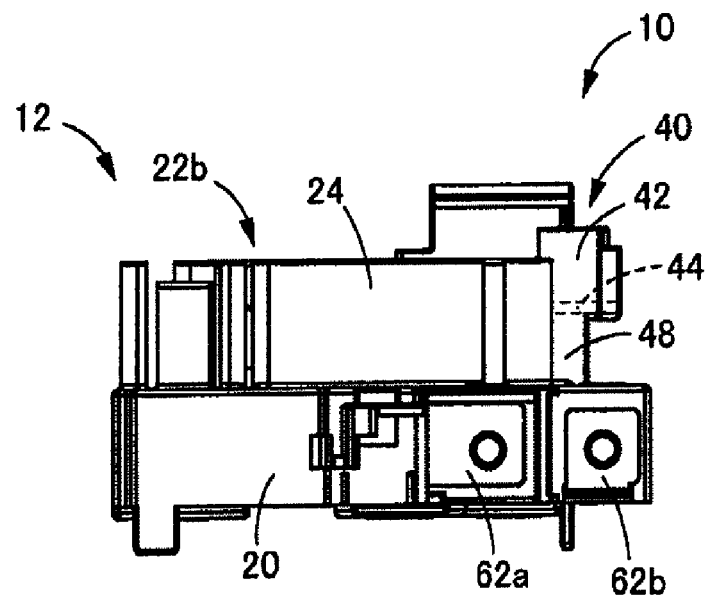
FIG. 4 is a side view of the electric junction box shown in FIG. 1 from a direction different from FIG. 3.
Figure 5:
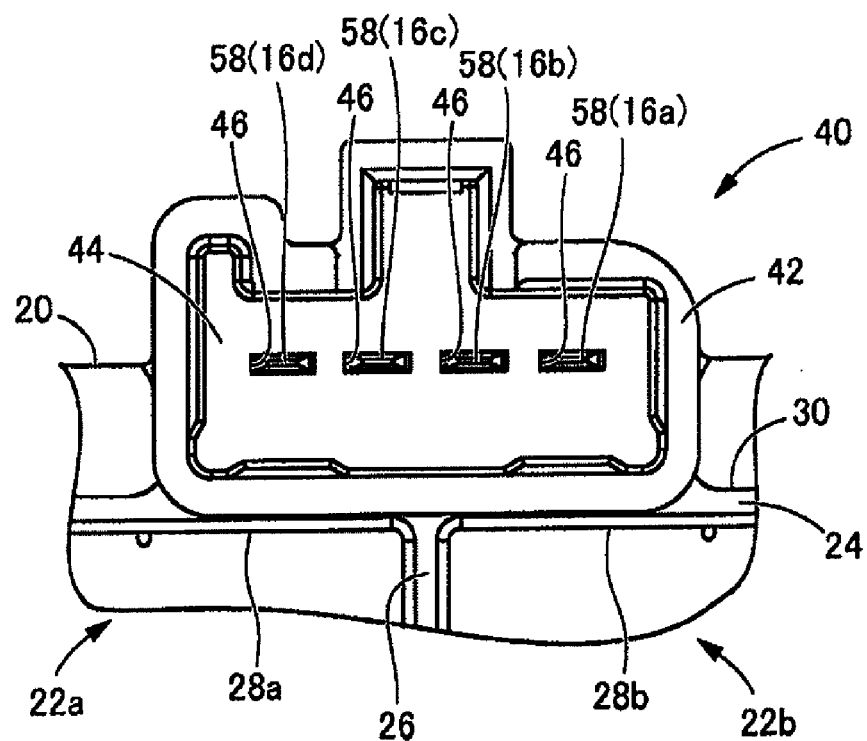
FIG. 5 is an enlarged view of a major portion of the electric junction box shown in FIG. 1.

A connector housing 40 is integrally provided on the external peripheral surface 30. A connector is mounted in the connector housing 40, the connector conducting power to relay coils (not shown in the drawing) mounted in the relay housings 22a, 22b, and 22c. As shown in FIG. 5, the connector housing 40 has substantially a rectangular peripheral wall 42 open to above (upward in FIG. 4), similar to the relay housings 22a and 22b. The peripheral wall 42 includes the peripheral wall 24 of the relay housings 22a and 22b on one surface. The peripheral wall 42 straddles the relay housings 22a and 22b and projects outside (upward in FIG. 5) of the upper case 12 from the external peripheral surface 30. In the present embodiment in particular, the peripheral wall 42 of the connector housing 40 projects more outward than the peripheral wall portion 20 of the upper case 12. Thus, the connector housing 40 and the relay housings 22a and 22b are provided adjacently with the peripheral wall 24 in between. The peripheral wall 42 projects higher (upward in FIG. 4) than the peripheral wall 24 of the relay housings 22a and 22b, so as to allow easy insertion and removal of the connector.

Figure 3:
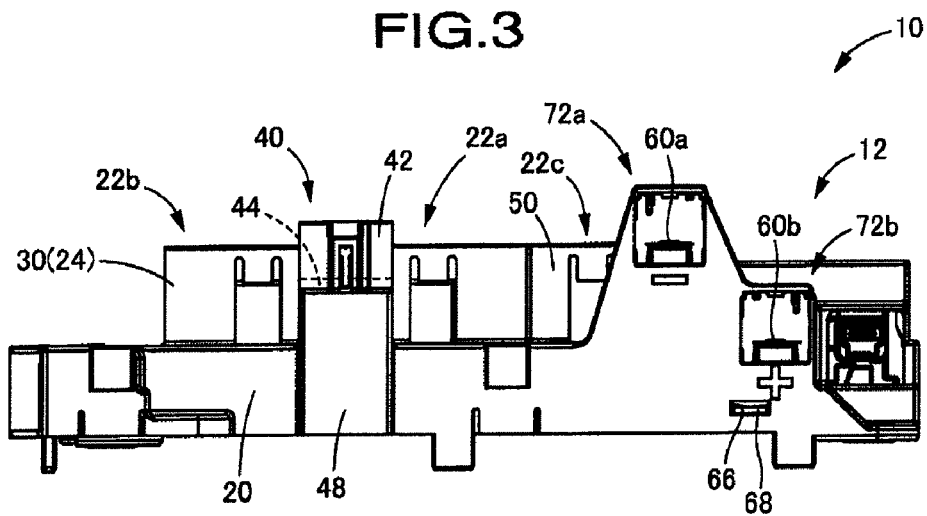
FIG. 3 is a side view of the electric junction box shown in FIG. 1.

A bottom wall portion 44 is provided inside the peripheral wall 42. In the bottom wall portion 44, a plurality of (four in the present embodiment) power supply terminal through-holes 46 are provided, through which external power supply terminals 58 provided in the bus bars 16 hereinafter described are inserted. As shown in FIGS. 3 and 4, the bottom wall portion 44 is positioned in an intermediate portion in the height direction (vertical direction in FIGS. 3 and 4) of the peripheral wall 24 of the relay housings 22a and 22b.

Furthermore, a reinforcing projection 48 extends downward (downward in FIGS. 3 and 4) from the bottom wall portion 44 of the connector housing 40. The reinforcing projection 48 straddles the peripheral wall 24 of the relay housings 22a and 22b and the peripheral wall portion 20 of the upper case 12. The reinforcing projection 48 has substantially a longitudinal block shape projecting outside from the peripheral wall 24 and the peripheral wall portion 20. The reinforcing projection 48 extends from the bottom wall portion 44 up to a projecting end portion (lower end portion in FIG. 3) from the plate portion 18 of the peripheral wall portion 20. The projecting size of the reinforcing projection 48 from the peripheral wall 24 is smaller than the bottom wall portion 44. The reinforcement projection 48 is solid at least in a position in which the power supply terminal through-holes 46 in the bottom wall portion 44 are provided. The power supply terminal through-holes 46 penetrate the reinforcing projection 48.

In addition, the upper case 12 is provided with the relay housing 22c in the present embodiment. The relay housing 22c is provided adjacent to the relay housing 22a on the side opposite to the relay housing 22b. A peripheral wall 50 of the relay housing 22c extends from the peripheral wall 24 of the relay housings 22a and 22b. The relay housing 22c has a slightly smaller opening than the relay housings 22a and 22b. The relay housing 22c is provided in a offset position relative to the aligned relay housings 22a and 22b. Similar to the relay housings 22a and 22b, the relay housing 22c is provided with the coil terminal through-holes 34a and 34b and the switch terminal through-holes 38a and 38b. The coil terminal through-holes 34a and 34b are provided more proximate to the connector housing 40 than the switch terminal through-holes 38a and 38b.

The lower case 14 is composed of a non-conductive synthetic resin, as shown in FIG. 1. The lower case 14 has substantially a rectangular box shape open to the upper case 12 and provided with a peripheral wall portion 54 projecting from an external peripheral portion of a plate portion 52. The lower case 14 is provided with bus bar housings 56 that correspond to the bus bars 16 from a plan view, the bus bar housings 56 being formed into recesses surrounded by projections projecting from the plate portion 52 and ribs.

The plurality of bus bars 16 are housed between the upper case 12 and the lower case 14. The bus bars 16 are formed by press-punching a metal plate, substantially similar to a conventional structure.

Of the plurality of bus bars 16, the external power supply terminals 58 are provided in the end portions of the bus bars 16a to 16d, in particular. The external power supply terminals 58 each extend in a long plate shape with a relatively narrow constant width. The external power supply terminals 58 are integrally provided with the bus bars 16a to 16d and bent so as to stand therefrom.

Furthermore, the bus bar 16b is provided with three relay coil power supply terminals 32a in the end portion. The bus bars 16a, 16c, and 16d are each provided with one relay coil power supply terminal 32b in the end portion. The relay coil power supply terminals 32a and 32b have a tub shape having a relatively wide width. The relay coil power supply terminals 32a and 32b are integrally provided with the bus bars 16a to 16d and bent so as to stand therefrom.

As conventionally known, the remaining bus bars 16 are provided appropriately in the end portions with the relay switch terminals 36a and 36b; connector connection terminals 60a and 60b to connect with external connectors; external connection terminals 62a and 62b to connect with external electric devices; and an electrical component connection terminal 64 to connect with another electrical component.

The plurality of bus bars 16 are fitted into the corresponding bus bar housings 56 in the lower case 14. The upper case 12 is covered, and then the bus bars 16 are housed between the upper case 12 and the lower case 14. The upper case 12 and the lower case 14 are locked to each other, and thus the electric junction box 10 is provided. To lock the upper case 12 and the lower case 14 to each other, a plurality of engagement portions 66 and a plurality of engagement projections 68 are engaged, the engagement portions 66 being provided in the peripheral wall portion 20 of the upper case 12 and each having a through-hole shape or a recess shape open to the internal surface of the peripheral wall 20, the engagement projections 68 being provided in the peripheral wall 54 of the lower case 14.

As shown in FIG. 2, the bus bars 16a to 16d straddle the connector housing 40 and the relay housings 22a, 22b, and 22c in the state housed in the upper case 12 and the lower case 14. The external power supply terminals 58 of the bus bars 16a to 16d project inside of the peripheral wall 42 of the connector housing 40, passing through the power supply terminal through-holes 46 of the connector housing 40 and penetrating the bottom wall portion 44. The three relay coil power supply terminals 32a of the bus bar 16b are provided in positions corresponding to the respective coil terminal through-holes 34a of the relay housing 22a, 22b, and 22c. The relay coil power supply terminal 32b of the bus bar 16c is provided in a position corresponding to the coil terminal through-hole 34b of the relay housing 22a. Similarly, the relay coil power supply terminal 32b of the bus bar 16a is provided in a position corresponding to the coil terminal through-hole 34b of the relay housing 22b. The relay coil power supply terminal 32b of the bus bar 16d is provided in a position corresponding to the coil terminal through-hole 34b of the relay housing 22c. Thereby, the relay coil power supply terminals 32a of the bus bar 16b and the relay coil power supply terminals 32b of the bus bars 16a, 16c, and 16d are provided adjacently in the relay housings 22a, 22b, and 22c, respectively. The bus bars 16a to 16d thus form conductive paths from the external power supply terminals 58 provided in the connector housing 40 to the relay coil power supply terminals 32a and 32b provided in the relay housings 22a, 22b, and 22c. Furthermore, the relay switch terminals 36a and 36b of the bus bars 16 are provided in positions corresponding to the switch terminal through-holes 38a and 38b in the relay housings 22a, 22b, and 22c.

The electrical component connection terminal 64 of the bus bar 16 is provided in a position corresponding to a connection terminal through-hole 70 in the upper case 12 so as to be connected to an external electrical component (not shown in the drawing). As conventionally known, relay terminals are connected to the relay coil power supply terminals 32a and 32b, the relay switch terminals 36a and 36b, and the electrical component connection terminal 64. The relay terminals face the coil terminal through-holes 34a and 34b, the switch terminal through-holes 38a and 38b, and the connection terminal through-hole 70.

As shown in FIG. 3, the connector connection terminals 60a and 60b of the bus bar 16 are provided in connector housings 72a and 72b, respectively, of the upper case 12 through connecting holes (not shown in the drawing) connecting inside of the connector housings 72a and 72b so as to be connected to connectors (not shown in the drawing). Furthermore, as shown in FIG. 4, the external connection terminals 62a and 62b are provided on the external surface of the peripheral wall portion 20 of the upper case 12 so as to be connected to an external electrical component (not shown in the drawing).

In the electric junction box 10 having the structure above, the relays (not shown in the drawing) are mounted in the relay housings 22a, 22b, and 22c, respectively; the coil terminals of the relays are connected to the relay coil power supply terminals 32a and 32b; and the switch terminals of the relays are connected to the relay switch terminals 36a and 36b. A connector (not shown in the drawing) is connected to the connector housing 40. The connector is connected to a switch in a vehicle compartment, for example. Upon turning on of the switch, power is conducted to the external power terminals 58 in the connector housing 40 through the connector, then to the coils of the relays mounted in the relay housings 22a, 22b, and 22c. Thus, the connector connection terminal 60a and the external connection terminal 62a are conducted through the relay mounted in the relay housing 22a, and thereby the power is conducted to an electrical component connected to the external connection terminal 62a. Similarly, the connector connection terminal 60b and the external connection terminal 62b are conducted through the relay mounted in the relay housing 22b, and thereby the power is conducted to an electrical component connected to the external connection terminal 62b. Furthermore, the connector connection terminal 60b and the electrical component connection terminal 64 are conducted through the relay mounted in the relay housing 22c, and thereby the power is conducted to an electrical component connected to the electrical component connection terminal 64. Upon turning off of the switch in the compartment, the power is cut off to the external power supply terminals 58 and the relay coils. Thereby, the power is cut off to the electrical components connected to the external connection terminals 62a and 62b and the electrical component connection terminal 64.

In the electric junction box 10 having the structure according to the embodiment, the relay housings 22a and 22b are provided adjacently with the partition wall 26 therebetween. The relays mounted in the relay housings 22a and 22b are thus disposed proximately, thereby achieving downsizing of the electric junction box 10.

Furthermore, the connector housing 40 to which the connector that controls the relays mounted in the relay housings 22a and 22b is connected is provided on the external peripheral surface 30 of the peripheral wall 24 of the relay housings 22a and 22b. The connector housing 40 is thus disposed proximate to the relay housings 22a and 22b, thereby further improving space efficiency.

Integrating the relay housings 22a and 22b having the partition wall 26 therebetween and the connector housing 40 effectively ensures the support strength in insertion and removal of the connector to and from the connector housing 40. Accordingly, the connector housing 40 can project outside of the peripheral wall portion 20 of the upper case 12 while ensuring the support strength, thus further efficiently ensuring the internal space of the electric junction box 10. In addition, the bottom wall portion 44 of the connector housing 40 is provided in the intermediate portion in the height direction of the peripheral wall 24 of the relay housings 22a and 22b, the bottom wall portion 44 having a smaller opening area and a shorter perimeter compared with the relay housings 22a and 22b and being advantageous in strength. Thus, the bottom wall portion 44 provides a reinforcing effect to the peripheral wall 24. In the present embodiment, the reinforcing projection 48 extending downward from the connector housing 40 straddles the peripheral wall 24 of the relay housings 22a and 22b and the peripheral wall portion 20 of the upper case 12, thus achieving a superior support effect for the connector housing 40 and reinforcing effect for the peripheral wall 24.

Since the connector housing 40 is disposed proximate to the relay housings 22a and 22b, the length of the bus bars 16a to 16d can be short, the bus bars 16a to 16d being provided from the external power supply terminals 58 of the connector housing 40 to the relay coil power supply terminals 32a and 32b of the relay housings 22a and 22b. Thus, a metal material of the bus bars 16 can be reduced, and the production cost can be reduced. In particular, the three conductive paths are shared by the bus bar 16d, the three conductive paths extending from the three relay coil power supply terminals 32a of the relay housings 22a, 22b, and 22c, respectively, to the external power supply terminals 58. Thus, the space efficiency is further enhanced.

In particular, the electric junction box 10 according to the embodiment is disposed in a vehicle while the opening direction of the relay housings 22a and 22b is directed substantially horizontally (upward in FIG. 2 is directed perpendicularly upward). According to the present embodiment, the relay coil power supply terminals 32a and 32b of the relay housings 22a to 22c are all provided more proximate to the connector housing 40 than the relay switch terminals 36a and 36b. Thus, the relay switch terminals 36a and 36b can be provided perpendicularly lower than the relay coil power supply terminals 32a and 32b. For instance, even in the case where contact dust is generated from the relays mounted in the relay housings 22a, 22b, and 22c, the contact dust can be collected perpendicularly downward where there is no impact to the relay coil power supply terminal 32a and 32b and the relay switch terminals 36a and 36b.

The embodiment of the present invention is explained above. The present invention, however, is not limited by specific descriptions thereof. For instance, it is possible to provide more groups of the pair of relay housings and the connector housing that straddles the relay housings.

The connector housing does not have to protrude outside of the case, but may be positioned in the case. Furthermore, the reinforcing projection 48 in the embodiment above is not necessarily required.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An electric junction box comprising:
 a case that houses a bus bar and includes an internal circuit; and
 a plurality of relay housings open to outside of the case, wherein
 the plurality of relay housings are integrally provided, and include a plurality of openings separated by a partition wall that is shared by adjacent relay housings, the partition wall forming a portion of a relay housing wall;
 a connector housing straddling the adjacent relay housings having the partition wall therebetween, and being integrally provided on external peripheral surfaces thereof, the connector housing utilizing a peripheral wall of the adjacent relay housings, the connector housing conducting power to a coil and being open to a same direction as the adjacent relay housings;
 a relay coil power supply terminal for each of the relay housing is provided on the peripheral wall side on which the connector housing is provided; and
 the bus bar is disposed straddling the adjacent relay housings and the connector housing, and the bus bar forms a conductive path from an external power supply terminal provided in the connector housing to the relay coil power supply terminal provided in each of the adjacent relay housings.

2. The electric junction box according to claim 1, wherein the peripheral wall of the relay housings integrally provided with the connector housing extends along a peripheral wall portion of the case; and the connector housing projects outside of the peripheral wall portion of the case.

3. The electric junction box according to claim 1, wherein a bottom wall portion is provided to the connector housing at an intermediate portion in a height direction of the peripheral wall of the relay housings; and the external power supply terminal passes through the bottom wall portion of the connector housing and projects into the connector housing.

4. The electric junction box according to claim 3, wherein the peripheral wall of the relay housings integrally provided with the connector housing extends along a peripheral wall portion of the case; and the connector housing projects outside of the peripheral wall portion of the case.

5. The electric junction box according to claim 1, wherein a plurality of bus bars are provided; at least one of the bus bars is integrally provided with the external power supply terminal in the connector housing and the plurality of relay coil power supply terminals in the respective plurality of relay housings; and the conductive path from the external power supply terminal to the plurality of relay coil power supply terminals is shared.

6. The electric junction box according to claim 5, wherein a bottom wall portion is provided to the connector housing at an intermediate portion in a height direction of the peripheral wall of the relay housings; and the external power supply terminal passes through the bottom wall portion of the connector housing and projects into the connector housing.

7. The electric junction box according to claim 6, wherein the peripheral wall of the relay housings integrally provided with the connector housing extends along a peripheral wall portion of the case; and the connector housing projects outside of the peripheral wall portion of the case.

8. The electric junction box according to claim 5, wherein the peripheral wall of the relay housings integrally provided with the connector housing extends along a peripheral wall portion of the case; and the connector housing projects outside of the peripheral wall portion of the case.

* * * * *